(12) United States Patent
Seita et al.

(10) Patent No.: US 6,899,781 B2
(45) Date of Patent: May 31, 2005

(54) METHOD FOR FORMING RESIN COMPOSITE MATERIAL

(75) Inventors: Masaru Seita, Saitama (JP); Hideki Tsuchida, Hasuda (JP); Masaaki Imanari, Misato (JP); Koichi Yomogida, Saitama (JP); Hidemi Nawafune, Takatsuki (JP)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/286,607

(22) Filed: Nov. 1, 2002

(65) Prior Publication Data

US 2004/0001957 A1 Jan. 1, 2004

(30) Foreign Application Priority Data

Nov. 8, 2001 (JP) ........................... 2001-343721

(51) Int. Cl.[7] ............................................... B44C 1/165
(52) U.S. Cl. ........................................ 156/230; 156/233
(58) Field of Search ........................... 428/457, 458; 156/230, 233

(56) References Cited

U.S. PATENT DOCUMENTS

| | | | | |
|---|---|---|---|---|
| 3,561,995 | A | | 2/1971 | Wu et al. ................... 428/409 |
| 3,642,584 | A | * | 2/1972 | Quinn et al. ................ 205/167 |
| 3,819,497 | A | | 6/1974 | Grunwald et al. .......... 205/126 |
| 4,563,371 | A | | 1/1986 | Sirinyan et al. ............ 427/305 |
| 4,568,413 | A | | 2/1986 | Toth et al. .................. 156/151 |
| 5,120,590 | A | | 6/1992 | Callahan et al. ............. 428/76 |
| 6,740,425 | B2 | | 5/2004 | Seita et al. ................. 428/626 |
| 2001/0027922 | A1 | | 10/2001 | Brock et al. ................ 205/170 |
| 2003/0003307 | A1 | | 1/2003 | Tsuchida et al. ............ 428/413 |
| 2004/0072015 | A1 | | 4/2004 | Seita et al. ................. 428/689 |
| 2004/0101665 | A1 | | 5/2004 | Seita et al. ................. 428/209 |

FOREIGN PATENT DOCUMENTS

| | | |
|---|---|---|
| DE | 36 20 601 A | 12/1987 |
| EP | 0 485 176 | 5/1992 |
| JP | 2001-073159 A | 3/2001 |

OTHER PUBLICATIONS

Abstract—Jung et al., "Studies on the preparation and properties of conductive polymers IV. Novel Method to prepare metalized plastics from metal chelates of poly(amide imides)"; Applied Polymer Science (1991), 42(8), pp. 2267–2277.

Abstract—Jung et al., "Studies on the preparation and properties of conductive polymers. III. Metallized polymer films by retroplating out"; Journal of Applied Polymer Science (1991), 42(8), pp. 2237–2245.

(Continued)

*Primary Examiner*—Monique R. Jackson
(74) *Attorney, Agent, or Firm*—S. Matthew Cairus

(57) ABSTRACT

This invention offers a method for forming a resin composite material, containing the steps of: (1) treating the surface of a carrier resin to treatment introduce ion exchange groups, (2) introducing metal ions to treat the carrier resin surface by treating the surface of said carrier resin with a solution containing metal ions, (3) converting said metal ions to a component containing a metal element, (4) forming a metal foil on top of said component containing a metal element, and (5) transferring said metal foil to a resin substrate by heating said metal foil. This method provides a carrier resin substrate having a metal foil of any desired thickness laminated or cast onto it. In this way a carrier resin containing a metal foil, particularly a copper foil, having a thickness, such as 8 $\mu$m or less, can be prepared that is otherwise difficult to prepare using conventional methods.

13 Claims, 3 Drawing Sheets

OTHER PUBLICATIONS

Chao et al., "Studies on the preparation and properties of conductive polymer. I. Novel method to prepare metalized plastic form metal chelate of poly(vinyl alcohol)"; Journal of Applied Polymer Science (1990), 40(1–2), pp. 53–66.

Chao et al., "Studies on the preparation and properties of conductive polymers. Part II. Novel method to prepare metalized plastics from metal chelates of polyamides"; Journal of Applied Polymer Science (1991), 42(2), pp. 439–451.

Patent Abstracts of Japan, vol. No. 1996, Dec. 26 1996 & JP 08 209354 A (Nippon Riironaale KK), Aug. 13, 1996.

Patent Abstracts of Japan, vol. No. 2000, No. 20, Jul. 10, 2001 & JP 2001 073159 A (Nippon Riironaaru KK), Mar. 21, 2001.

Patent Abstracts of Japan, vol. No. 1998, No. 14, Dec. 31, 1998 & JP 10 245444 A (Nippon Riironaale KK), Sep. 14, 1998.

* cited by examiner

METHOD FOR FORMING RESIN COMPOSITE MATERIAL

BACKGROUND OF THE INVENTION

This invention pertains to a resin composite material having a metal foil on top of a resin substrate, and a method for forming such resin composite material. This invention also pertains to a metal foil attached to a carrier resin used in this method for forming a resin composite material.

Metal-resin composite materials, beginning with copper-clad laminate boards, are used in a wide range of industrial fields such as electronic parts and mechanical parts. Especially with the rapid development of the electronics industry in recent years, copper-clad laminate boards have come to be used in a wide range of fields such as flexible printed circuit boards (FPC), film carriers for TAB (Tape Automated Bonding), multilayer circuit boards, or COF (Chip On FPC) in electronic devices such as hard disk drives, liquid crystal display elements (LCD), portable telephones, game machines, automobiles, cameras, or audio equipment. Various resins are used for the resin substrate in copper-clad laminate boards depending on factors such as use conditions and working characteristics, but polyamide resin is widely used as a resin substrate from the standpoint of superior properties such as heat resistance, flame resistance, mechanical strength, and electrical characteristics.

A number of methods are known for placing copper foil on resin substrates, beginning with polyimide resin substrates, and fabricating copper-clad laminate boards. One method is the method of forming copper foil directly on top of a resin substrate by applying electroless copper plating to a resin substrate, then applying electrolytic copper plating as required. Other methods using copper foil formed first are the laminating method of adhering copper foil to a resin substrate either with or without using an adhesive, then hot-fusing the copper foil to the resin substrate, and the casting method of forming a film by pouring molten resin over copper foil. Still another method is the sputtering method of sputtering copper onto a resin substrate in a vacuum, then obtaining the desired thickness of copper foil by electroless copper plating with the sputtered copper as the nucleus. Still another method, disclosed in Japan Unexamined Patent No. 8-209354, is the method of introducing acidic groups into a resin substrate and introducing metal ions, then reducing this to form a metal coating, followed by applying electroless or electrolytic copper plating as required.

In the method of forming copper foil directly on top of a resin substrate by applying electroless copper plating to a resin substrate, then applying electrolytic copper plating as required, however, palladium is used as a catalyst during electroless copper plating, and therefore, palladium must be removed during pattern formation. In addition, using particular resins, beginning with polyimide, can make it difficult to improve adhesion between the copper deposited electrolyticly and the resin substrate. Furthermore, even with resins capable of improving adhesion between electrolytic deposited copper and the resin substrate, such as epoxy resins, the surface of the resin substrate is subject to injury by etching which is done to improve adhesion.

In the laminating and casting methods using copper foil formed first, handling concerns limit the thickness of the copper foil used to a minimum of 8 μm. When a fine-pattern substrate is demanded for reasons such as developing the high-performance electronic devices of recent years, thinner copper foil is demanded in copper-clad laminate boards. In addition, when a copper-clad laminate board having 8 μm or less copper foil thickness is required, copper foil must be made thinner by a means such as etching after forming a conventional copper-resin composite material. Etching copper foil, however, has the problem that it is difficult to etch copper foil evenly, and copper foil becomes uneven in thickness.

The sputtering method has the problems of the large size of its apparatus, high costs, and lower productivity compared to other methods.

Furthermore, although the method of introducing acidic groups into a resin substrate and introducing metal ions, then forming a metal coating by reducing the metal ions, followed by applying electroless or electrolytic copper plating as required has the advantages of superior adhesion between the resin substrate and metal foil as well as being able to form a metal foil of a desired thickness uniformly, it has the problem that the surface of the resin substrate is subject to injury when introducing acidic groups to the resin substrate. In addition, it can be difficult to introduce acidic groups depending on the type of the resin used. Moreover, although the source cited earlier discloses that metal-resin composite materials formed by such a method have superior adhesion between the metal and the resin substrate, it is difficult for persons skilled in the art to transfer this superior adhesion to metal foils formed by such a method.

SUMMARY OF THE INVENTION

The present inventors discovered that a metal foil can be easily transferred to a resin substrate by heating a metal foil attached to a carrier resin formed by a particular method and which has markedly superior adhesion under normal conditions. This invention provides a method for forming resin composite material that unlike conventional methods for forming resin composite materials, can form a metal foil of a desired uniform thickness and can form composite material comprised of the desired type of resin without damaging the surface of the resin substrate that contacts the metal foil, uses a metal foil attached to a carrier resin having easy handling due to improved adhesion before heating, and has the metal foil and resin substrate described above; together with resin composite materials formed by said method.

This invention also provides a metal foil attached to a carrier resin used in the method for forming resin composite material described above, and capable of transferring copper foil by heating.

This invention provides a method for forming resin composite material, containing the steps of: (1) treating a surface of a carrier resin to introduce ion exchange groups, (2) introducing metal ions to the carrier resin surface by treating the carrier resin surface with a solution containing metal ions, (3) converting said metal ions to a component containing a metal element, (4) forming a metal foil on top of said component containing a metal element, and (5) transferring said metal foil to a resin substrate by heating said metal foil.

In addition, this invention provides resin composite materials formed by the method for forming resin composite material described above.

Furthermore, this invention provides a carrier resin having a metal foil prepared by the method including the steps of: (1) treating a surface of a carrier resin to introduce ion exchange groups, (2) introducing metal ions to the carrier resin surface by treating the carrier resin surface with a solution containing metal ions, (3) converting said metal ions to a component containing a metal element, and (4) forming a metal foil on top of said component containing a metal element, the metal foil being peelable from the carrier resin by heating.

The present invention also provides a method of forming a metal foil including the steps of: (1) treating a surface of a carrier resin to introduce ion exchange groups, (2) introducing metal ions to the carrier resin surface by treating the carrier resin with a solution including metal ions, (3) converting the metal ions to a component containing a metal element, (4) forming a metal foil on top of the component containing a metal element, and (5) separating the metal foil from the carrier resin.

DETAILED DESCRIPTION OF THE INVENTION

Figure 1:
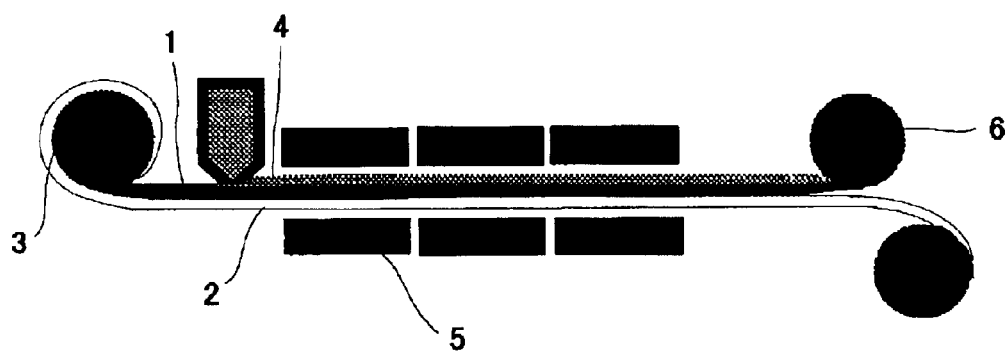
FIG. 1 illustrates a process of forming a polyimide metal-clad laminate board using a casting method.

This invention offers a method for forming resin composite material, containing the steps of: (1) treating a surface of a carrier resin to introduce ion exchange groups, (2) introducing metal ions to the carrier resin surface by treating the carrier resin surface with a solution including metal ions, (3) converting said metal ions to a component containing a metal element, (4) forming a metal foil on top of said component containing a metal element, and (5) transferring said metal foil to a resin substrate by heating said metal foil.

In Step (1): "treating a surface carrier resin to introduce ion exchange groups," first, a carrier resin is treated to introduce ion exchange groups, and groups capable of ion exchange are introduced into the carrier resin.

The carrier resin used in this invention can be any desired carrier resin and is not specially limited, so long as it is a carrier resin having the appropriate physical properties such as strength and corrosion resistance for the purposes of being able to form a metal foil on top of said carrier resin and being able to transfer said metal foil by heating. The carrier resin is preferably a sheet in terms of shape from the standpoint of being ideal for handling the metal foil formed. More preferably, when the carrier resin is a sheet, the thickness of such sheet is 5 $\mu$m to 100 $\mu$m, and more preferably 10 $\mu$m to 50 $\mu$m. Suitable carrier resins are not limited to resin molded products, but may be resin composites by way of reinforcing materials, such as materials reinforced by fiberglass between resins, or resin films formed on substrates comprised of other raw materials such as ceramics, glasses, or metals.

Exemplary carrier resins include, without limitation, thermoplastic resins, polyethylene resins such as high-density polyethylene, medium-density polyethylene, branching low-density polyethylene, straight-chain low-density polyethylene, or super high-molecular-weight polyethylene; polyolefin resins such as polypropylene resin, polybutadiene, polybutene resin, polybutylene resin, or polystyrene resin; halogenated resins such as polyvinyl chloride resin, polyvinylidene chloride resin, polyvinylidene chloride-polyvinyl chloride polymer resin, chlorinated polyethylene, chlorinated polypropylene, or tetrafluoroethylene; AS resins; ABS resins; MBS resins; polyvinyl alcohol resins; polyacrylic ester resins such as methyl polyacrylate; polymethacrylic ester resins such as methyl polymethacrylate; methyl-methacrylate-styrene copolymer resin; maleic anhydride-styrene copolymer resin; polyvinyl chloride resin; cellulose resins such as cellulose propionate resin or cellulose acetate resin; epoxy resins; polyimide resins; polyamide resins such as nylons; polyamide imide resins; polyallylate resins; polyether imide resins; polyether ether ketone resins; polyethylene oxide resins; polyester resins such as PET resin; polysulfone resins; polyvinyl ether resins; polyvinyl butyral resins; polyphenylene ether resins such as polyphenylene oxide; polyphenylene sulfide resins; polybutylene terephthalate resins; polymethylpentene resins; polyacetal resins; vinyl chloride-vinyl acetate copolymers; ethylene-vinyl acetate copolymers; ethylene-vinyl chloride copolymers; and copolymers and blends of these; thermosetting resins, including epoxy resins; xylene resins; guanamine resins, diallyl phthalate resins; vinyl ester resins; phenolic resins, unsaturated polyester resins; furan resins; polyimide resins; polyurethane resins, maleic acid resins; melamine resins; and urea resins; and mixtures of these; but are not limited to these. Preferred resins are epoxy resins, polyimide resins, vinyl resins, phenolic resins, nylon resins, polyphenylene ether resins, polypropylene resins, fluorinated resins, ABS resins, and mixtures of these. More preferred as carrier resins are epoxy resins, polyimide resins, and mixture of these. Most preferred are polyimide resins. In addition, the carrier resin may be comprised of one resin alone, or comprised of several resins. Furthermore, the surface of the carrier resin that is treated to introduce ion exchange groups may be formed of the resins described above, or may be a composite of these resins coated or laminated onto another substrate.

The groups having ion exchange capacity introduced to the surface of the carrier resin include, but are not limited to, cationic exchange groups or anionic exchange groups. Examples include carboxyl, thiocarboxyl, dithiocarboxyl, sulfo, sulfino, sulfeno, haloformamyl, carbamoyl, hydrazinocarbonyl, amidino, cyano, nitrilo, isocyano, cyanato, isocyanato, thiocyanato, isothiocyanato, formamyl, hydroxyl, carbonyl, thioformyl, thioxo, mercapto, hydropyroxyl, amino, imino, hydrazino, diazo, azido, nitro, and nitroso groups, but are not limited to these. Preferably, the groups having ion exchange capacity are hydroxyl, carbonyl, amino, imino, cyano, or nitro groups. For cationic exchange groups, ion exchange is performed in Step (2) by metal ions that are cations, and for anionic exchange groups, ion exchange is performed in Step (2) by metal ions that are anions.

Examples of the treatment to introduce ion exchange groups are plasma treatment and treatment by an ion exchange group introducing agent. The carrier resins may be treated by either plasma treatment or treatment by an ion exchange group introducing agent, or by both treatments. When both treatments are performed, they may be performed in any order.

When the treatment introducing ion exchange groups is plasma treatment, said treatment causes desorption of elements comprising the carrier resin (such as drawing out hydrogen) depending on the type of high energy activation, cross-linking or desaturation of branches, and introduction of groups having ion exchange capacity. Examples of ion exchange groups introduced by plasma treatment include, but are not limited to, oxygen-containing functional groups such as carboxyl, hydroxyl, or carbonyl groups when using oxygen or air plasma, nitrogen-containing functional groups such as amino, imino, or cyano groups when using ammonia or a mixed nitrogen and hydrogen gas plasma, and functional groups such as nitro groups when using a nitrogen gas plasma, but are not limited to these. In addition, other types of ion exchange groups can be introduced using gases other than the gases described above. Because plasma treatment introduces ion exchange groups onto the surface of carrier resins, this improves the hydrophilic property of the surface of nearly all carrier resins.

Any plasma treatment may be used so long as it can introduce an appropriate ion exchange group onto the surface of the carrier resin. Examples include vacuum plasma treatment and atmospheric plasma treatment, but are not limited to these. Atmospheric plasma (air at atmospheric pressure, i.e. approximately 1 atm) is preferred from the standpoint of capacity to treat large carrier resin samples and capacity for continuous treatment. Any suitable apparatus can be used for plasma treatment. Treatment conditions may be selected as appropriate to factors such as the type of carrier resin and type of component containing a metal element used. For vacuum plasma treatment, the discharge current is typically 20 to 200 mA at 20 kHz and preferably 50 to 150 mA at 20 kHz. Typically, such vacuum plasma treatment is performed at a pressure of 0.1 to 0.3 Pa. Treatment times using vacuum plasma are typically from 1 to 30 minutes and preferably from 10 to 20 minutes. Such vacuum plasma treatment may use oxygen, argon, $CO_2$, and $N_2$ as improving agents. For atmospheric plasma treatment, the pulse voltage is typically 70 to 100 kV and preferably 80 to 90 kV. In such atmospheric plasma treatment, a discharge gap of 1 to 3 cm is typical, with a 1 to 2 cm being preferred. Atmospheric plasma treatment times are typically 0.5 to 100 minutes and preferably 1 to 30 minutes. Furthermore, the treatment temperature during plasma treatment can be set as appropriate, but is preferably room temperature (approximately 20° C. to 30° C.) in terms of carrier resin stability and ease of handling. Gases in the atmosphere during plasma treatment include H, N, O, $N_2$, $O_2$, and $O_3$, but oxygen is preferred for treatment at atmospheric pressure.

The method for introducing ion exchange groups onto the surface of a carrier resin by plasma treatment is not specially limited. Various methods are possible, and groups can be introduced by an appropriate standard plasma treatment for the type of carrier resin used and the type of group introduced. The following is an example of a method for introducing carboxyl groups as acidic groups. After setting a carrier resin of polyimide resin film on a turntable inside a low-temperature microwave oxygen plasma treatment tank, a vacuum pump is operated to evacuate the treatment tank to 0.13 Pa or less, then nitrogen gas is introduced at a speed of 10 mL/min while still operating the vacuum pump. The carboxyl cationic exchange groups can be formed on the surface of the carrier resin by exposing the polyimide resin to a 50 mA discharge current for 5 minutes. The carboxyl cationic exchange groups can also be formed on the surface of a carrier resin by applying a high pulse voltage of 70 to 100 kV to polyimide resin across a narrow gap of about 1 cm.

The other type of treatment to introduce ion exchange groups which uses an ion exchange group introducing agent is performed by contacting the carrier resin with an ion exchange group introducing agent. The contact method and conditions such as time and temperature are set as appropriate to introduce the desired amount of groups having ion exchange capacity to the carrier resin without damaging the carrier resin. An example of a contact method is immersion, but is not limited to this. A treatment introducing ion exchange groups can be performed in Step (1) in this invention, but said treatment may be performed once, or may be performed several times using the same or different introducing agents.

The ion exchange group introducing agent should contain any desired chemical capable of introducing groups having ion exchange capacity into the carrier resin. This is preferably a Lewis acid or a Lewis base, but is not limited to these. Examples of suitable ion exchange group introducing agents include, but are not limited to, sulfonating agents such as sulfuric acid, fuming sulfuric acid, sulfur trioxide, chlorosulfuric acid, or sulfuryl hydrochloride; acids such as hydrochloric acid, nitric acid, acetic acid, formic acid, ascorbic acid, or lactic acid; alkalis such as sodium hydroxide, potassium hydroxide, or ammonia; and aminating agents, nitrating agents, cyaniding agents, or oxidizing agents other than these. Preferred introducing agents are sulfuric acid, potassium hydroxide, and sodium hydroxide.

When using sulfuric acid as the ion exchange group introducing agent, for example, the appropriate concentration of introducing agent is generally 5 to 17.5 mol/liter, and preferably 15 to 17 mol/liter. While less than 5 mol/liter may be used, the treatment time may be unacceptably long for certain applications. While greater than 17.5 mol/liter concentration may be used, it may produce a severe reaction with certain carrier resins and greatly change such resins. The treatment temperature is generally 20° C. to 90° C., and preferably 40° C. to 70° C. The typical treatment time is 30 seconds to 30 minutes, and preferably 2 to 20 minutes.

When using an alkaline solution such as an aqueous solution of potassium hydroxide or sodium hydroxide as the ion exchange group introducing agent, the concentration of alkaline solution is typically 0.1 to 10 mol/liter, and preferably 1 to 5 mol/liter. Greater than 10 mol/liter may be used, but such a concentration may attack the carrier resin and lead to deterioration of the resin substrate. Water or alcohol can be used as the solvent during alkaline treatment. The treatment temperature is 10° C. to 80° C., and preferably 25° C. to 50° C. The treatment time is 30 seconds to 10 minutes, and preferably 2 to 5 minutes. Using alcohol as the solvent can obtain the same effect as using water at the solvent, but at a lower alkaline concentration and lower temperature and/or shorter time.

In Step (2), "a step for introducing metal ions by treating the surface of said carrier resin by a solution containing metal ions," the carrier resin treated having ion exchange groups introduced in Step (1) described above is treated by a solution containing metal ions. It is considered that this treatment introduces metal ions into the groups having ion exchange capacity by an ion exchange reaction.

A solution having metal ions comprising the intended component containing a metal element may be used as the solution containing metal ions. For example, when forming a metal, a solution containing the desired metal ions may be used, and when forming an alloy, a solution containing the metal ions of some or all of the metal components comprising the alloy may be used. Moreover, when a solution containing the metal ions of some of the metal components comprising the alloy is used in Step (2), the desired alloy is produced by treating the metal ions with a reducing agent containing the remaining metal components in a later step.

Metal ions may be complex ions in solution, in which case, complex ions may be either complex cations or complex anions. Generally, an aqueous solution is used for the solution containing metal ions. Depending on the metal ions used, however, the medium may be an organic medium such as methanol, or an organic solution that is a mixed medium of water and an organic medium. Moreover, as required, the solution containing metal ions can contain components such as stabilizers to maintain a certain pH, or complexing agents to prevent metal ions from precipitating.

Examples of metal ions that can be contained in the solution containing metal ions used in this invention are metal ions comprised of any desired metal elements capable of being transferred to the component containing a metal element in Step (3). Suitable metal ions include, but are not limited to Sc, Ti, V, Cr, Mn, Fe, Co, Ni, Cu, Zn, Ga, Ge, As, Se, Y, Zr, Nb, Mo, Tc, Ru, Rh, Pd, Ag, Cd, In, Sb, Te, Hf, Ta, W, Re, Os, Ir, Pt, Au, Hg, Tl, Pb, Bi, Po, and mixtures of these. Preferably, the metal ions are ions of V, Cr, Mn, Fe, Co, Ni, Cu, Ga, As, Se, Mo, Ru, Rh, Pd, Ag, Cd, In, Sb, Te, Os, Ir, Pt, Au, Hg, Pb, Bi, and mixtures of these. More preferably, the metal ions are ions of V, Mn, Co, Ni, Cu, Ga, As, Se, Mo, Pd, Ag, In, Sb, Te, Pt, Au, Hg, Bi, and mixtures of these. Most preferably, the metal ions are ions of Co, Ni, Cu, Pd, Ag, Pt, Au, and mixtures of these.

Metal ions are generally distributed in the solution as a metal compound or a metal salt. The type of metal compound or metal salt used is not specially restricted, and any appropriate soluble metal compound or metal salt for the type of metal may be used. Examples include carboxylic acid salts such as formates, acetates, chloroacetates, or oxalates; sulfates, sulfides, thiosulfates, fluorides, hydrochlorides, bromides, iodides, nitrates, nitrites, bicarbonates, hydroxides, phosphates, phosphites, pyrophosphates, metaphosphates, selenates, thiocyanates, tetrafluoroborates, trisethylenediamine salts, cyanides, chlorates, perchlorates, bromates, perbromates, iodates, and periodates, but are not limited to these. Sulfates, sulfides, and nitrates are preferred, and sulfates are more preferred.

The typical concentration of metal ions in the solution is 0.01 to 1 mol/liter, and preferably 0.03 to 0.1 mol/liter. If the intended component containing a metal element contains several metal elements, the solution may contain metal ions at a molar ratio corresponding to the molar ratio of the metal elements in the final component formed. In this case, the total concentration of these several metal ions may be within the ranges given above.

The method for treating the carrier resin by the solution containing metal ions is not specially limited, but normally the carrier resin treated in Step (1) may be immersed in the solution containing metal ions. This treatment may be performed at a temperature such as about 20° C. to 80° C. and preferably 25° C. to 65° C. Such treatment is typically conducted for a time such as 1 to 10 minutes and preferably 3 to 5 minutes. After treating the carrier resin with the solution containing metal ions, a treatment such as washing with water and drying can be performed as required. Preferably, Step (3) is performed after washing with water.

In Step (3): "a step for converting said metal ions to a component containing a metal element," a component containing a metal element is formed on the surface of the carrier resin by converting the metal ions introduced in Step (2) described above. "Converting" in this invention means converting the bonded state of a metal element to a different bonded state from its original state. Converting must form a component containing a metal element in this invention, and converting not forming a component containing a metal element is not included in this invention. The treatment converting metal ions performed depends on the final intended type of component containing a metal element.

The converting treatment in Step (3) is typically a reducing treatment when the component containing a metal element is a metal component, a treatment by a solution containing sulfide when the component containing a metal element is a metal sulfide component, and a treatment by a solution containing hydroxide when the component containing a metal element is a metal hydroxide component, but is not limited to these.

When the treatment converting metal ions is a reducing treatment, the reducing treatment is not specially limited, and may use any method so long as it is a method capable of producing a metal by converting the metal ions introduced onto the surface of the carrier resin. Normally, however, reducing treatment is performed by the method of immersing the carrier resin treated in Step (2) in a solution containing a reducing agent.

The reducing agent used to reduce metal ions introduced onto the surface of the carrier resin is not specially limited so long as a metal can be deposited by reducing said metal ions. Normally, the solution containing a reducing agent is used in the form of an aqueous solution. Examples of reducing agents used in this case include sodium borohydride, dimethylamine borane (DMAB), trimethylamine borane (TMAB), hydrazine, formaldehyde, and derivatives of these compounds; sulfites such as sodium sulfite; and hypophosphites such as sodium hypophosphite. Any desired standard reducing agent can be used, however, without limiting to these. The concentration of reducing agent in the aqueous solution is normally about 0.0025 to 3 mol/liter, and preferably about 0.01 to 1.5 mol/liter. The reducing temperature is normally about 20° C. to 90° C., and preferably about 25° C. to 80° C. Suitable reducing times are 1 to 10 minutes and preferably 3 to 5 minutes.

Selenium urea, arsenites or the like, antimony(III) hydrochloride, and tellurium hydrochloride can also be used as the reducing agent. When using these reducing agents, a metal compound with the metal component in the reducing agent—that is, the metal component of reduced Se when using selenium urea, As when using an arsenite, Sb when using antimony(III) hydrochloride, or Te when using tellurium hydrochloride—can be formed at the same time that metal ions chemically adsorbed to ion exchange groups are reduced. That is, a metal selenide, metal arsenite, metal antimonide, or metal telluride is formed.

The conditions for using reducing agents such as selenium or arsenites may be the same as the conditions for the various reducing agents described above, and these can be used together with the reducing agents described above. Use with other reducing agents is especially preferred when using selenium urea because other reducing agents can improve the stability of the selenium urea in the reducing agent solution.

When it is difficult to produce a metal adequately by reducing treatment using an aqueous solution containing the reducing agents described above, such reducing treatment can be performed by using an organic solvent solution containing a reducing agent having stronger reducing power. Examples of reducing agents that can be used with this type of organic solvent include metals such as Li, Na, or K (solvent: solvents such as liquid ammonia or amines), trialkyl aluminum (solvent: solvents such as dioxane, toluene, or tetrahydrofuran), and tin hydroxide compounds such as tri-n-butyltin (solvent: solvents such as ether solvents, benzene, or toluene). When performing reducing treatment by using these organic solvent solutions containing reducing agents, factors such as the concentration of reducing agent and reducing conditions may be set as appropriate for the type of metal salt to be reduced such that adequate metal is produced.

Reducing treatment can also be performed by exposing the carrier resin having metal ions to electromagnetic radiation. Reducing treatment by exposure to electromagnetic radiation is a step for using electromagnetic excitation energy in a reduction reaction to deposit a metal from introduced metal ions. Any desired electromagnetic radiation can be used for the electromagnetic radiation used in reducing treatment so long as it has excitation energy capable of reducing metal ions, but ultraviolet radiation is preferred. Electromagnetic radiation having between 10 W and 10 kW power can be used, but 10 W to 1 kW is preferred for shortening treatment time. The exposure time to electromagnetic radiation may be from 30 seconds to 1 hour, but from 1 to 10 minutes is preferred.

As required, the carrier resin can be exposed to ultraviolet radiation by installing a mask such as a glass mask. When a glass mask is installed, metal ions in only the part required can be reduced selectively. The mask may be any type of mask so long as it is not permeable to ultraviolet radiation.

When forming a metal sulfide component, the carrier resin treated by a solution containing metal ions in Step (2) is treated by a solution containing sulfide. The sulfide contained in the solution containing sulfide is not specially limited so long as it produces sulfide ions in solution. Preferred examples of such sulfides include sodium sulfide, potassium sulfide, and ammonium sulfide.

The content of sulfide in the solution containing sulfide is generally about 0.05 to 1.2 mol/liter, and preferably about 0.1 to 0.5 mol/liter. Less than 0.05 mol/liter sulfide concentration may be used but it is more difficult to deposit a metal sulfide. Greater than 1.2 mol/liter concentration may be used but it produces hardly improvement in effect and is uneconomical. The solution containing sulfide may be an aqueous solution or a solution comprised of organic solvent or a mixture of water and organic solvent. The pH of the solution containing sulfide may be from weakly acidic to alkaline. Preferably, the solution is buffered to pH 4 to 11, and especially 6 to 10.

Normally, treatment by a solution containing sulfide may be performed by the method of immersing the carrier resin having metal ions introduced in Step (2) in a solution containing a sulfide. The treatment temperature is generally 20° C. to 80° C., and preferably 25° C. to 60° C. Temperatures lower than 20° C. may be used but tend to form inadequate metal sulfide. Temperatures greater than 80° C. may be used but the solution may become unstable. The treatment time is normally 2 to 30 minutes.

When forming a metal hydroxide component, the carrier resin treated by a solution containing metal ions in Step (2) is treated by a solution containing hydroxide, then a metal oxide component is formed on said carrier resin by heat treatment. The hydroxide in this treatment step can be any desired compound so long as it is a compound capable of forming hydroxide ions in solution. Examples of such hydroxides include NaOH, $NH_4OH$, and KOH.

The concentration of hydroxide in the solution containing hydroxide is generally about 0.015 to 12 mol/liter, and preferably about 0.1 to 5 mol/liter. Too low a hydroxide concentration does not form adequate hydroxide, while too high a hydroxide concentration is undesirable because it may deteriorate the resin. The solution containing hydroxide may be an aqueous solution or a solution comprised of organic solvent or a mixture of water and organic solvent.

Normally, treatment by a solution containing hydroxide may be performed by the method of immersing the carrier resin having metal ions introduced in Step (2) in a solution containing a hydroxide. The treatment temperature is generally 10° C. to 80° C., and preferably 20° C. to 50° C. Too low a treatment temperature tends to form inadequate metal hydroxide, while too high treatment temperature is undesirable because it may deteriorate the resin. The treatment time is normally 2 to 30 minutes.

A metal hydroxide layer is formed on the surface of the carrier resin by treating the carrier resin with a solution containing hydroxide in this way, then a metal oxide component is formed on said carrier resin by dehydration using heat treatment. The heat treatment depends on the heat resistance of the resin, but preferably is performed at a high temperature within a range that does not deteriorate the resin. For example, heating to 80° C. to 150° C. is preferred when the resin substrate is an epoxy resin. Heating to 80° C. to 180° C. is preferred when the resin substrate is a polyamide resin. The heating time is normally 30 to 120 minutes. The heating atmosphere is not specially limited, and heat treatment may be performed in air. When forming a compound such as $Fe_3O_4$, however, heat treatment is preferably performed in a reducing atmosphere such as a hydrogen atmosphere, and the heating atmosphere may be set as appropriate for the properties of the intended component.

The component containing a metal element in this invention can be any desired component so long as a metal foil can be formed on top of said component containing a metal element in Step (4). Examples include metals, metal oxides, metal sulfides, metal arsenides, metal antimonides, metal selenides, and metal tellurides, but are not limited to these. Preferably, the component containing a metal element is a metal from the standpoint of easily forming a metal foil in Step (4).

The "component containing a metal element" in the step for forming a resin composite material in this invention refers to a metal or a metal compound. The metal may be a metal comprised of a single metal element, or an alloy comprised of two or more metal elements. The metal may be formed in any of a state in which the metal elements of the above-mentioned alloy form a solid, an amorphous state that is a mixture of component metals comprised of each of these metal elements, or a combination of these states. "Metal compound" refers to compounds in which several types of metal elements form an intermetallic compound, or compounds comprised of one or more metal elements and one or more other elements. The metal compound contained in the component containing a metal element may be one type or several types. "Metal element" means an element that is a metal simplex. Examples of metals include, without limitation, Sc, Ti, V, Cr, Mn, Fe, Co, Ni, Cu, Zn, Ga, Ge, As, Se, Y, Zr, Nb, Mo, Tc, Ru, Rh, Pd, Ag, Cd, In, Sb, Te, Hf, Ta, W, Re, Os, Ir, Pt, Au, Hg, Tl, Pb, Bi, and Po.

When the component containing a metal element is a metal, said metal is preferably selected from Sc, Ti, V, Cr, Mn, Fe, Co, Ni, Cu, Zn, Ga, Ge, As, Se, Y, Zr, Nb, Mo, Tc, Ru, Rh, Pd, Ag, Cd, In, Sb, Te, Hf, Ta, W, Re, Os, Ir, Pt, Au, Hg, Tl, Pb, Bi, Po, and alloys of these. More preferably, this is a metal selected from V, Cr, Mn, Fe, Co, Ni, Cu, Ga, As, Se, Mo, Ru, Rh, Pd, Ag, Cd, In, Sb, Te, Os, Ir, Pt, Au, Hg, Pb, Bi, and alloys of these. Still more preferably, this is a metal selected from V, Mn, Co, Ni, Cu, Ga, As, Se, Mo, Pd, Ag, In, Sb, Te, Pt, Au, Hg, Bi, and alloys of these. More preferably, this is a metal selected from Co, Ni, Cu, Pd, Ag, Pt, Au, and alloys of these. Most preferably, this is Cu or an alloy containing Cu.

The metal compound is a compound in which several types of metal elements form an intermetallic compound, or a compound comprised of one or more metal elements and one or more other elements. The metal compound used as the component containing a metal element in this invention can be any desired metal compound so long a metal foil can be formed on top of said metal compound. Examples include metal arsenides such as GaAs and InAs; metal antimonides such as GaSb and InSb; metal selenides such as ZnSe, CdSe, and HgSe; metal tellurides such as CdTe and HgTe; metal sulfides such as CuS, PdS, CdS, ZnS, and AgS; metal oxides such as $Fe_2O_3$, $Fe_3O_4$, CrO, Co—Ni—O, and MnO—ZnO—$Fe_2O_3$; metal hydroxides; metal nitrides; metal silicides; and metal borides; but are not limited to these.

The metal or metal compound in the component containing a metal element described above and the resin used in the carrier resin described above can be selected as desired in this invention. When the component containing a metal element is a metal, the carrier resin in the combination of carrier resin and metal is preferably a resin selected from epoxy resins, polyimide resins, vinyl resins, phenolic resins, nylon resins, polyphenylene ether resins, polypropylene resins, fluorinated resins, ABS resins, and mixtures of these, and the metal is preferably selected from V, Mn, Co, Ni, Cu, Ga, As, Se, Mo, Pd, Ag, In, Sb, Te, Pt, Au, Hg, Bi, and alloys of these. More preferably, the carrier resin is selected from of epoxy resins, polyimide resins, vinyl resins, phenolic resins, nylon resins, polyphenylene ether resins, polypropylene resins, ABS resins, and mixtures of these, and the metal is selected from V, Mn, Co, Ni, Cu, Ga, As, Se, Mo, Pd, Ag, In, Sb, Te, Pt, Au, Hg, Bi, and alloys of these. Still more preferably, the carrier resin is selected from epoxy resins, polyimide resins, polyphenylene ether resins, ABS resins, and mixtures of these, and the metal is a metal selected from V, Mn, Co, Ni, Cu, Ga, As, Se, Mo, Pd, Ag, In, Sb, Te, Pt, Au, Hg, Bi, and alloys of these.

When the component containing a metal element is a metal sulfide, the carrier resin in the combination of carrier resin and metal sulfide is preferably a resin selected from epoxy resins, polyamide resins, polyphenylene ether resins, fluorinated resins, ABS resins, and mixtures of these, and the metal sulfide is preferably selected from CuS, CdS, ZnS, PdS, $Ag_2S$, $As_4S_4$, $As_2S_3$, $As_2S_6$, TeS, $TeS_3$, and mixtures of these. More preferably, the carrier resin is selected from epoxy resins, polyamide resins, polyphenylene ether resins, ABS resins, and mixtures of these, and the metal sulfide is selected from Cus, CdS, ZnS, PdS, $Ag_2S$, and mixtures of these.

When the component containing a metal element is a metal oxide, the carrier resin in the combination of carrier resin and metal oxide is preferably selected from epoxy resins, polyamide resins, fluorinated resins, and mixtures of these, and the metal oxide is preferably selected from FeO, NiO, CoO, MnO, and mixtures of these. More preferably, the carrier resin is selected from epoxy resins, polyamide resins, and mixtures of these, and the metal oxide is selected from FeO, NiO, CoO, MnO, and mixtures of these In Step (4): "a step for forming a metal foil attached to a carrier resin by forming a metal foil on top of said component containing a metal element," a metal foil attached to a carrier resin is formed. The method for forming a metal foil in Step (4) can be any desired standard method and is not specially limited so long as it can form a metal foil of the desired thickness using the desired type of metal. Preferably, however, electroless metal plating, electrolytic metal plating, or a combination of these is used to form the metal foil. The conditions for this electroless metal plating or electrolytic metal plating can be any standard conditions, and can be set as appropriate for factors such as the thickness of metal foil and type of metal desired.

For example, any desired electroless copper plating method, electrolytic copper plating method, or combination of these can be used when forming a copper foil as the metal foil. An example of an electroless copper plating method that can be used is electroless copper plating using palladium as a catalyst and formaldehyde as a reducing agent, but is not limited to this, and an electroless copper plating method that does not use formaldehyde may also be used. Electrolytic copper plating methods may use any of a copper sulfate bath, copper cyanide bath, or copper pyrophosphate bath for the electrolytic copper plating bath, and conditions such as current density, bath temperature, copper concentration, and additives can be set as appropriate for factors such as the thickness of metal foil desired. Forming copper foil was described as an example, but a metal foil can be formed by standard methods using other types of metals as well. The metal comprising the metal foil formed in Step (4) can be any desired metal, but preferably is selected from Sc, Ti, V, Cr, Mn, Fe, Co, Ni, Cu, Zn, Ga, Ge, As, Se, Y, Zr, Nb, Mo, Tc, Ru, Rh, Pd, Ag, Cd, In, Sb, Te, Hf, Ta, W, Re, Os, Ir, Pt, Au, Hg, Tl, Pb, Bi, Po, and alloys of these. More preferably, the metal is selected from V, Cr, Mn, Fe, Co, Ni, Cu, Ga, As, Se, Mo, Ru, Rh, Pd, Ag, Cd, In, Sb, Te, Os, Ir, Pt, Au, Hg, Pb, Bi, and alloys of these. Still more preferably, the metal is selected from V, Mn, Co, Ni, Cu, Ga, As, Se, Mo, Pd, Ag, In, Sb, Te, Pt, Au, Hg, Bi, and alloys of these. Even more preferably, the metal is selected from Co, Ni, Cu, Pd, Ag, Pt, Au, and alloys of these. Most preferably, the metal foil is a copper foil or copper alloy foil.

Because a metal foil is formed on top of the component containing a metal element formed in Step (3) of the present method, said component containing a metal element is present on top of the metal foil when the metal foil is transferred to the resin substrate in Step (5). When the presence of said component containing a metal element is not desired in the final resin composite material obtained by the method of this invention, said component containing a metal element can be removed by a means such as etching. Making the component containing a metal element and the metal foil the same metal is preferred from the standpoint of not requiring such a removal treatment.

The thickness of the metal foil formed in Step (4) can be set as appropriate for the conditions demanded by the final resin composite material to be produced. Because a metal foil of any desired thickness can be formed in Step (4), the method of this invention can transfer a metal foil having a thickness of 8 μm or less that would have been impossible in terms of handling by the prior art method of forming a metal foil first, then transferring this to a resin substrate by casting or laminating. In addition, the etching required in the casting or laminating method described above is not required to form the metal foil having such a thickness. From these standpoints, the thickness of the metal foil in the metal foil attached to the carrier resin formed in Step (4) is preferably 0.5 μm to 5 μm, and more preferably 2 μm to 4 μm thick.

In Step (5), "a step for transferring said metal foil to the resin substrate by heating said metal foil attached to a carrier resin," metal foil is transferred from the metal foil attached to a carrier resin formed in Step (4) to a resin substrate. This is transferred by adhering or forming a resin substrate on top of the metal foil attached to a carrier resin. During this, the carrier resin is made removable, such as peelable, from the metal foil by heating.

The component containing a metal element formed in Steps (1) to (3) in the method of this invention is more evenly dispersed and has superior adhesion to the substrate resin compared to introducing by electroless plating as in prior art. In addition, when the component containing a metal element forms a film, it has more uniform thickness compared to a resin composite material having a metal film formed by electroless plating during thin film formation as in prior art. As a result, the metal foil in the metal foil attached to a carrier resin formed in Step (4) of this invention has superior adhesion and more uniform film thickness than when formed by electroless plating as in prior art methods.

As explained above, the carrier resin and the metal foil in the metal foil attached to the carrier resin of this invention have extremely high adhesion so long as they are not heated. The special characteristic of this invention is that heating such a metal foil attached to a carrier resin reduces adhesion enough to enable transfer of said metal foil. This point is in no way disclosed or suggested by previous sources.

The heating conditions in Step (5) may be varied as appropriate for factors such as the type of carrier resin and metal used and the thickness of the carrier resin and the metal foil, and are not specially limited so long as metal foil can be transferred from a metal foil attached to a carrier resin under these heating conditions. Generally, the heating temperature has a lower limit of 30° C., preferably 100° C., and more preferably 150° C. The upper limit of the heating temperature is set as appropriate for the heat-resistance temperature of the resin substrate to which the metal foil is to be transferred, but is generally 300° C., preferably 250° C., and more preferably 200° C.

The resin substrate to which the metal foil is transferred in Step (5) can be a resin substrate comprised of any desired resin and of any desired shape so long as it is a resin substrate having properties such as strength or corrosion resistance appropriate for the intended use, and is not specially limited. In addition, resin substrates that can be used in this invention are not limited to molded resin products, but may be resin composites by way of reinforcing materials, such as materials reinforced by fiberglass between resins, or resin films formed on substrates comprised of other raw materials such as ceramics, glasses, or metals. The thickness of the resin substrate is set as appropriate for the demanded thickness of the resin composite material and the thickness of the metal foil, but its lower limit is limited due to handling problems and its upper limit is limited from the standpoint of thickness during laminating. The thickness of the resin substrate is generally from 10 μm to 100 μm, and preferably 25 μm to 50 μm.

Any desired resin can be used for the resin substrate. Examples are thermoplastic resins, including polyethylene resins such as high-density polyethylene, medium-density polyethylene, branching low-density polyethylene, straight-chain low-density polyethylene, or super high-molecular-weight polyethylene; polyolefin resins such as polypropylene resin, polybutadiene, polybutene resin, polybutylene resin, or polystyrene resin; halogenated resins such as polyvinyl chloride resin, polyvinylidene chloride resin, polyvinylidene chloride-polyvinyl chloride polymer resin, chlorinated polyethylene, chlorinated polypropylene, or tetrafluoroethylene; AS resins; ABS resins; MBS resins; polyvinyl alcohol resins; polyacrylic ester resins such as methyl polyacrylate; polymethacrylic ester resins such as methyl polymethacrylate; methyl-methacrylate-styrene copolymer resin; maleic anhydride-styrene copolymer resin; polyvinyl chloride resin; cellulose resins such as cellulose propionate resin or cellulose acetate resin; epoxy resins; polyimide resins; polyamide resins such as nylons; polyamide imide resins; polyallylate resins; polyether imide resins; polyether ether ketone resins; polyethylene oxide resins; polyester resins such as PET resin; polysulfone resins; polyvinyl ether resins; polyvinyl butyral resins; polyphenylene ether resins such as polyphenylene oxide; polyphenylene sulfide resins; polybutylene terephthalate resins; polymethylpentene resins; polyacetal resins; vinyl chloride-vinyl acetate copolymers; ethylene-vinyl acetate copolymers; ethylene-vinyl chloride copolymers; and copolymers and blends of these; thermosetting resins, including epoxy resins; xylene resins; guanamine resins, diallyl phthalate resins; vinyl ester resins; phenolic resins, unsaturated polyester resins; furan resins; polyimide resins; polyurethane resins, maleic acid resins; melamine resins; and urea resins; and mixtures of these; but are not limited to these. Preferred resins are epoxy resins, polyimide resins, vinyl resins, phenolic resins, nylon resins, polyphenylene ether resins, polypropylene resins, fluorinated resins, and ABS resins. More preferred resins are epoxy resins, polyimide resins, polyphenylene ether resins, fluorinated resins, and ABS resins. Most preferred are polyamide resins. In addition, the resin substrate may be comprised of one resin alone, or comprised of several resins. Furthermore, the transfer surface may be a resin substrate, or may be a composite coated or laminated onto another substrate.

The method for transferring the metal foil to a resin substrate in Step (5) can be any desired standard method so long as it can form a resin composite material, but casting or laminating is preferred. Casting or laminating can use any desired method normally used to form resin composite materials except for the point that heating is required in the method of this invention, and conditions and the like can also be set as appropriate. An overview of casting and laminating methods will be explained below using FIGS. 1 to 3, but these methods are not limited to the modes shown in the figures.

"Casting" is a method for coating a molten resin or resin precursor onto a metal foil, then curing the resin and adhering the metal foil by heating. As an example of a casting method, FIG. 1 shows production of a polyamide copper-clad laminate board using casting. Referring to FIG. 1, polyamide precursor varnish 4 is cast onto the copper foil 1 side of metal foil attached to carrier resin 3 having copper foil 1 on top and polyimide film carrier 2 on the bottom, which is then heated by heater 5. Heating cures polyimide precursor varnish 4 to a polyimide film and adheres it to the copper foil. This heating also makes copper foil 1 peelable from polyimide film carrier 2. After heating, copper-clad laminate board 6 comprised of the polyimide formed from polyimide precursor varnish 4 and copper foil 1 is obtained.

"Laminating" is a method for laminating a metal foil to a resin substrate using an adhesive, or laminating by hot-fusing a film-shaped resin substrate to a metal foil. In the laminating method, the resin composite material obtained becomes a three-layer structure when a different type of resin from the resin substrate is used as the adhesive, and the resin composite material obtained becomes a two-layer structure when the same type of resin as the resin substrate is used as an adhesive or no adhesive is used.

The adhesive used in the laminating method can be any desired standard adhesive. Examples include thermosetting resin adhesives, beginning with polyimide resins, epoxy resins, clear resins, melamine resins, phenolic resins, and polyester resins; thermoplastic resin adhesives, beginning with vinyl acetate resin, vinyl chloride-vinyl acetate copolymer resin, nitrocellulose, ethylene-vinyl acetate copolymer resin, cyanoacrylate, anaerobic acrylic resins, urethane resins, polyamides, and acrylic resins; synthetic rubber adhesives, beginning with chloroprene rubber, nitryl rubber, recycled rubber latex, SBR, urethane rubber, polystyrene-polyisoprene-polystyrene block copolymer, butyl rubber, polyisobutylene, and silicone; and polymer-alloy adhesives such as vinyl-phenolic, rubber-phenolic, epoxy-phenolic, nylon-epoxy, and nitryl-epoxy; but are not limited to these.

Figure 2:
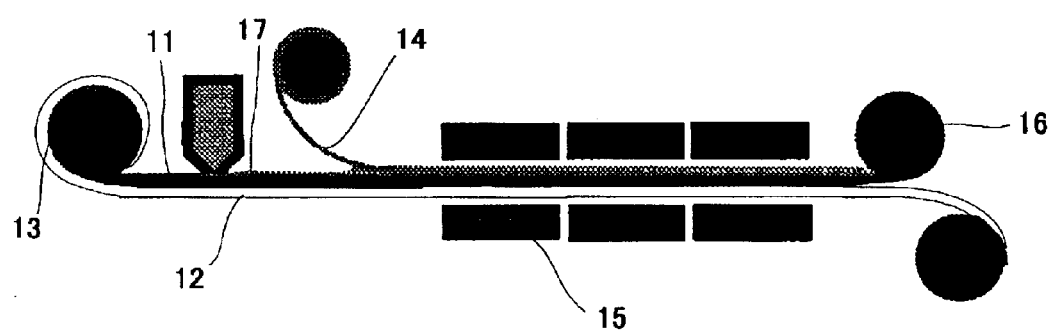
FIGS. 2 and 3 illustrates a process of forming a polyimide metal-clad laminate board using a laminating method.
Figure 3:
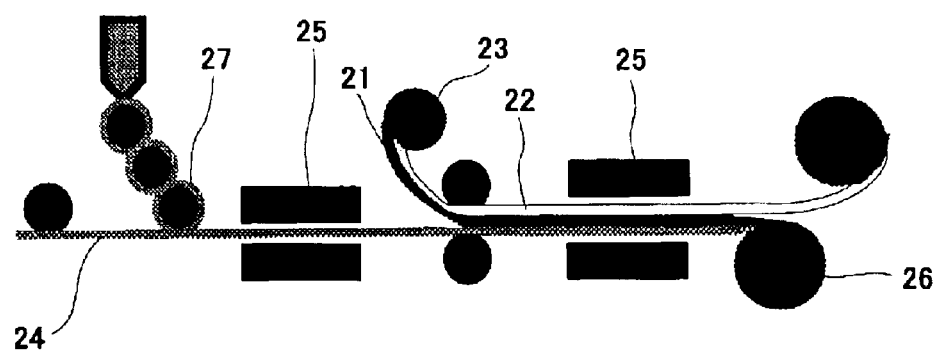

As examples of laminating methods, FIGS. 2 and 3 show production of a polyamide copper-clad laminate board using laminating.

Referring to FIG. 2, adhesive 17 is coated onto the copper foil 11 side of metal foil attached to carrier resin 13 having copper foil 11 on top and polyimide film carrier 12 on the bottom, polyimide film 14 is set on top of this, then heated by heater 15. Heating cures the adhesive and adheres copper foil 11 to polyimide film 14. This heating also makes copper foil 11 peelable from polyamide film carrier 12. After heating, copper-clad laminate board 16 comprised of the three layers of polyimide film 14, adhesive 17, and copper foil 11 is obtained.

Referring to FIG. 3, polyimide precursor varnish 27 is coated onto the top of polyimide film 24, then heated by heater 25, and the polyimide precursor varnish becomes B-staged. Next, metal foil attached to carrier resin 23 having copper foil 21 on the bottom and polyimide film carrier 22 on top is placed on top of polyimide film 24, then heated by heater 25. This cures the B-staged polyimide, and adheres polyimide film 24 to copper foil 21. This heating also makes copper foil 21 peelable from polyimide film carrier 22. After heating, copper-clad laminate board 26 comprised of the two layers of polyimide film 24 and copper foil 21 is obtained.

A resin composite material is formed by the method of this invention. Said resin composite material can be used in a wide range of industrial fields, such as electronic parts and mechanical parts. In particular, the resin composite material of this invention can be applied to applications such as printed circuit boards (FPC), film carriers for TAB (Tape Automated Bonding), multilayer circuit boards, or COF (Chip On FPC).

Below, this invention will be explained by working examples, but this invention is not limited to the scope described in the working examples.

EXAMPLE 1

Polyimide film (CAPTONE 200EN, manufactured Du Pont-Toray Co., Ltd.) was treated by following the steps in Table 1, and a metal foil attached to a carrier resin (polyamide film having approximately 2 μm metal foil) was formed.

TABLE 1

| Treatment Chemical | | Temperature | Time |
| --- | --- | --- | --- |
| 8 M KOH | | 70° C. | 2 minutes |
| water | | room temperature | 1 minute |
| 0.05 M $CuSO_4.5H_2O$ | | 25° C. | 5 minutes |
| water | | room temperature | 1 minute |
| 0.01 M $NaBH_4$ | | 25° C. | 20 minutes |
| water | | room temperature | 1 minute |
| $CuSO_4.5H_2O$: | 75 g/L | 25° C. | 5 minutes |
| $H_2SO_4$: | 190 g/L | | |
| Cl: | 50 mg/L | | |
| COPPERGLEAM ST-901: (manufactured by LeaRonal Japan, Inc.) | 5 mL/L | | |

TABLE 1-continued

| Treatment Chemical | | Temperature | Time |
| --- | --- | --- | --- |
| current density: | 2 A/dm² | | |
| water | | room temperature | 1 minute |
| drying | | 100° C. | 30 seconds |

A polyimide precursor varnish was coated on top of the copper foil of the polyimide film having approximately 2 μm copper foil formed by the steps in Table 1 following the mode shown in FIG. 1, then the polyimide precursor varnish was cured to obtain a polyimide resin. This heating made the polyimide film clear and peelable during heating. As a result, a polyimide copper-clad laminate board having 2 μm copper foil on the surface could be produced.

EXAMPLE 2

Polyimide film (CAPTONE 200H, manufactured Du Pont-Toray Co., Ltd.) was treated by following the steps in Table 2, and a metal foil attached to a carrier resin (polyamide film having approximately 2 μm metal foil) was formed.

TABLE 2

| Treatment Chemical | | Temperature | Time |
| --- | --- | --- | --- |
| 16 M $H_2SO_4$ | | 50° C. | 4 minutes |
| water | | room temperature | 1 minute |
| 1 M KOH | | 25° C. | 5 minutes |
| water | | room temperature | 1 minute |
| 0.05 M $CuSO_4.5H_2O$ | | 25° C. | 20 minutes |
| water | | room temperature | 1 minute |
| 0.01 M $NaBH_4$ | | 25° C. | 20 minutes |
| water | | room temperature | 1 minute |
| $CuSO_4.5H_2O$: | 75 g/L | 25° C. | 5 minutes |
| $H_2SO_4$: | 190 g/L | | |
| Cl: | 50 mg/L | | |
| COPPERGLEAM ST-901: (manufactured by LeaRonal Japan, Inc.) | 5 mL/L | | |
| current density: | 2 A/dm² | | |
| water | | room temperature | 1 minute |
| drying | | 100° C. | 30 seconds |

An epoxy resin adhesive was coated on top of the copper foil of the polyimide film having approximately 2 μm copper foil formed by the steps in Table 2 following the mode shown in FIG. 2, and the polyimide film that was to become a polyimide resin substrate was laminated. Next, the adhesive was cured by heating to 150° C. This heating made the polyimide film clear and peelable. As a result, a polyimide copper-clad laminate board having 2 μm copper foil on the surface could be produced.

EXAMPLE 3

Polyimide film (CAPTONE 200H, manufactured Du Pont-Toray Co., Ltd.) was treated by following the steps in Table 3, and a metal foil attached to a carrier resin (polyamide film having approximately 2 μm metal foil) was formed.

TABLE 3

| Treatment Chemical | | Temperature | Time |
|---|---|---|---|
| 16 M $H_2SO_4$ | | 50° C. | 4 minutes |
| water | | room temperature | 1 minute |
| 1 M KOH | | 25° C. | 5 minutes |
| water | | room temperature | 1 minute |
| 0.05 M $CuSO_4.5H_2O$ | | 25° C. | 20 minutes |
| water | | room temperature | 1 minute |
| 0.01 M $NaBH_4$ | | 25° C. | 20 minutes |
| water | | room temperature | 1 minute |
| $CuSO_4.5H_2O$: | 75 g/L | 25° C. | 5 minutes |
| $H_2SO_4$: | 190 g/L | | |
| Cl: | 50 mg/L | | |
| COPPERGLEAM ST-901: (manufactured by LeaRonal Japan, Inc.) | 5 mL/L | | |
| current density: | 2 A/dm² | | |
| water | | room temperature | 1 minute |
| drying | | 100° C. | 30 seconds |

A polyimide precursor varnish was coated onto a polyimide film following the mode shown in FIG. 3, then heated and laminated to the copper foil of the polyimide film having approximately 2 μm copper foil formed by the steps in Table 3. Next, the adhesive was cured by heating to 200° C. This heating made the polyimide film clear and peelable. As a result, a polyimide copper-clad laminate board having 2 μm copper foil on the surface could be produced.

As explained above, a metal foil attached to a carrier resin having a metal foil of any desired thickness can be formed by the method of this invention for forming a resin composite material. As a result, a metal foil, especially a copper foil, that was difficult to make having a uniform thickness, especially a thickness of 8 μm or less, in prior art in terms of handling can be laminated or cast onto a resin substrate. In addition, the steps for forming a resin composite material can be simplified by not requiring the etching treatment formerly required when forming a resin composite material having a metal foil, especially a copper foil, of uniform thickness as described above. Furthermore, because the metal foil formed by the present method has a uniform thickness regardless of the thickness, the resin composite material can be formed to a more uniform thickness than by conventional, above-mentioned etching treatment. This effect is especially useful in resin composite materials demanding fine patterning.

Because metal foil first formed on a carrier resin is then laminated or cast onto a new resin substrate in the method of this invention, this invention has the useful effect that the resin substrate is not subject to injury by treatment forming a metal foil directly on a resin substrate. In addition, because metal foil first formed on a carrier resin can then be transferred to any desired resin substrate in the method of this invention, this invention has the useful effect that formerly difficult resins and even resin complexes can be used. In addition, the method of forming a resin composite material by introducing ion exchange groups into a resin substrate and introducing metal ions, then reducing the metal ions to form a metal film, followed by applying electroless or electrolytic copper plating as required is useful when using resins in which it is difficult to introduce ion exchange groups directly. Moreover, this invention has the useful effect that it can obtain a resin composite material having improved adhesion between the metal foil and the resin substrate compared to forming directly by electroless copper plating. Furthermore, because the carrier resin is peelable during laminating or casting, in which heating is required to adhere the metal foil to the resin substrate, this invention has the useful effect of simplifying the steps for forming a resin composite material.

What is claimed is:

1. A method for forming resin composite material, comprising the steps of (1) treating a surface of a carrier resin to introduce ion exchange groups, (2) introducing metal ions to the carrier resin surface by treating the carrier resin surface with a solution containing metal ions, (3) converting said metal ions to a component containing a metal or metal compound, (4) forming a metal foil on top of said component containing a metal or metal compound, and (5) transferring said metal foil to a resin substrate by heating said metal foil.

2. The method of claim 1, wherein the ion exchange groups are introduced by plasma treatment or treatment by an ion exchange group introducing agent.

3. The method of claim 1, wherein the component containing a metal or metal compound comprises a metal selected from the group consisting of Sc, Ti, V, Cr, Mn, Fe, Co, Ni, Cu, Zn, Ga, Ge, As Se, Y, Zr, Nb, Mo, Tc, Ru, Rh, Pd, Ag, Cd, In, Sb, Te, Hf, Ta, W, Re, Os, Ir, Pt, Au, Hg, Tl, Pb, Bi, Po, and mixtures of these.

4. The method of claim 1, wherein the component containing a metal or metal compound is selected from the group consisting of metal arsenides, metal antimonides, metal selenides, metal tellurides, metal sulfides, and metal oxides.

5. The method of claim 1, wherein the metal foil is formed by electroless metal plating, electrolytic metal plating or a combination of these methods.

6. The method of claim 1, wherein the metal foil comprises a metal selected from the group consisting of Sc, Ti, V, Cr, Mn, Fe, Co, Ni, Cu, Zn, Ga, Ge, As Se, Y, Zr, Nb, Mo, Tc, Ru, Rh, Pd, Ag, Cd, In, Sb, Te, Hf, Ta, W, Re, Os, Ir, Pt, Au, Hg, Tl, Pb, Bi, Po, and mixtures of these.

7. The method of claim 1, wherein the metal foil is a copper foil or copper alloy foil.

8. The method of claim 1, wherein the component containing a metal or metal compound formed in Step (3) comprises the same metal as the metal foil formed in Step (4).

9. The method of claim 1, wherein the metal foil is transferred to the resin substrate in Step (5) by laminating or casting.

10. The method of claim 1, wherein the thickness of the metal foil formed in Step (4) is from 0.1 μm to 8 μm.

11. The method of claim 1, wherein the carrier resin and the resin substrate are polyimide resin.

12. The method of claim 1, wherein the thickness of the resin substrate is from 10 μm to 100 μm.

13. The method of claim 1 wherein the metal compound is chosen from metal arsenides, metal antimonides, metal selenides, metal tellurides, metal sulfides, metal oxides, metal hydroxides, metal nitrides, metal silicides and metal borides.

* * * * *